US011778764B2

(12) United States Patent
Zhang et al.

(10) Patent No.: US 11,778,764 B2
(45) Date of Patent: Oct. 3, 2023

(54) FOLDING DEVICE AND DISPLAY DEVICE

(71) Applicant: BOE TECHNOLOGY GROUP CO., LTD., Beijing (CN)

(72) Inventors: Shouchuan Zhang, Beijing (CN); Shangchieh Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 138 days.

(21) Appl. No.: 17/614,355

(22) PCT Filed: Dec. 25, 2020

(86) PCT No.: PCT/CN2020/139631
§ 371 (c)(1),
(2) Date: Nov. 25, 2021

(87) PCT Pub. No.: WO2022/134075
PCT Pub. Date: Jun. 30, 2022

(65) Prior Publication Data
US 2022/0400564 A1    Dec. 15, 2022

(51) Int. Cl.
*H05K 5/00* (2006.01)
*H05K 5/02* (2006.01)
*F16C 11/04* (2006.01)

(52) U.S. Cl.
CPC ............ *H05K 5/0226* (2013.01); *F16C 11/04* (2013.01)

(58) Field of Classification Search
None
See application file for complete search history.

(56) References Cited

U.S. PATENT DOCUMENTS 10,317,934 B2 *  6/2019  Hampton .............. G06F 1/1601
10,480,227 B1    11/2019  Chen
(Continued)

FOREIGN PATENT DOCUMENTS

CN    108322567 A    7/2018
CN    110164316 A    8/2019
(Continued)

OTHER PUBLICATIONS

Written Opinion for PCT Patent Application No. PCT/CN2020/139631 dated Sep. 26, 2021.

*Primary Examiner* — Anthony Q Edwards
*Assistant Examiner* — Rashen E Morrison
(74) *Attorney, Agent, or Firm* — Perilla Knox & Hildebrandt LLP; Kenneth A. Knox

(57) ABSTRACT

The present disclosure discloses a folding mechanism and a display device. The folding device includes a supporting plate, a lifting plate, at least one rotatable plate, a transmission assembly, a first elastic member, and at least one pushing wheel. The supporting plate has a first surface and a second surface. The lifting plate is arranged on a side of the first surface away from the second surface. The first elastic member is provided between the lifting plate and the supporting plate. The pushing wheel is connected with the rotatable plate through the transmission assembly. Rotating of the rotatable plate from the folding position to the unfolding position causes the pushing wheel to push the lifting plate to a supporting position, and during rotating of the rotatable plate from the unfolding position to the folding position, the first elastic member enables the lifting plate to move to an avoidance position.

20 Claims, 9 Drawing Sheets

(56) References Cited

U.S. PATENT DOCUMENTS

| | | | | |
|---|---|---|---|---|
| 11,385,686 B2* | 7/2022 | Ai | ……………… | G06F 1/1616 |
| 2022/0011827 A1* | 1/2022 | Kim | ……………… | G06F 1/1616 |
| 2022/0137675 A1* | 5/2022 | Kuramochi | ………… | G06F 1/1641 |
| | | | | 361/679.27 |

FOREIGN PATENT DOCUMENTS

| | | | |
|---|---|---|---|
| CN | 209373959 U | 9/2019 | |
| CN | 110312007 A | 10/2019 | |
| CN | 209724948 U | 12/2019 | |
| CN | 210324958 U | 4/2020 | |
| CN | 111491043 A | 8/2020 | |
| CN | 111613131 A | 9/2020 | |
| CN | 111885235 A | 11/2020 | |
| CN | 111968513 A | 11/2020 | |
| CN | 111968514 A | 11/2020 | |
| CN | 112041781 A | 12/2020 | |
| CN | 112071204 A | 12/2020 | |
| KR | 20180010019 A | 1/2018 | |
| KR | 20190124110 A | 11/2019 | |
| KR | 102158620 B1 | 9/2020 | |
| TW | M587286 U | 12/2019 | |
| WO | 2019209060 A1 | 10/2019 | |

* cited by examiner

US 11,778,764 B2

FOLDING DEVICE AND DISPLAY DEVICE

CROSS-REFERENCE TO RELATED APPLICATION

The present application is a national phase application under 35 U.S.C. § 371 of International Application No. PCT/CN2020/139631, filed on Dec. 25, 2020, the contents of which being incorporated by reference in their entirety herein.

TECHNICAL FIELD

The present disclosure relates to display technologies and, in particular, to a folding mechanism and a display device.

BACKGROUND

At present, the application of foldable flexible display panels is becoming more and more extensive. During use, users can fold the foldable flexible display panels into a bent state or unfold them into a flat state, so as to realize a form change to adapt to different use scenarios. In the related art, it is usually necessary to install a folding device for a flexible display panel. However, during the folding procedure, problems, such as wrinkles or damages, may happen easily in the folding area.

It should be noted that the information disclosed in the Background section above is only for enhancing the understanding of the background of the present disclosure, and thus may include information that does not constitute prior art known to those of ordinary skill in the art.

SUMMARY

An objective of the present disclosure is to provide a folding mechanism and a display device.

According to an aspect of the present disclosure, there is provided a folding device for a flexible display panel, the folding device including:

a supporting plate having a first surface and a second surface which are opposite to each other;

a lifting plate arranged on a side of the first surface away from the second surface, wherein there is a gap between the lifting plate and the first surface;

at least one rotatable plate arranged on the side of the first surface away from the second surface and distributed on a side of the lifting plate along a first direction, wherein:

the at least one rotatable plate is rotatably connected to the supporting plate and is rotatable between a folding position and an unfolding position;

the at least one rotatable plate and the supporting plate are coplanar in the unfolding position;

the at least one rotatable plate and the supporting plate are located on different planes in the folding position; and the at least one rotatable plate is used for attaching the flexible display panel to allow the flexible display panel to fold or unfold; and a transmission assembly arranged on the supporting plate and connected with the at least one rotatable plate;

a first elastic member arranged between the lifting plate and the supporting plate, wherein the first elastic member is used to apply to the lifting plate a force toward the first surface;

at least one pushing wheel arranged between the lifting plate and the supporting plate, and connected to the at least one rotatable plate through the transmission assembly, wherein the at least one pushing wheel is rotatable under driving of the at least one rotatable plate, a contour of the at least one pushing wheel includes at least a distal end point and a proximal end point, and a distance between the distal end point and a rotation axis of the at least one pushing wheel and a distance between the proximal end point and the rotation axis of the at least one pushing wheel are different;

wherein rotating of the at least one rotatable plate from the folding position to the unfolding position causes the at least one pushing wheel to push the lifting plate to a supporting position in a direction away from the first surface, and during rotating of the at least one rotatable plate from the unfolding position to the folding position, the first elastic member enables the lifting plate to move to an avoidance position in a direction close to the first surface.

In an exemplary embodiment of the present disclosure, the transmission assembly includes:

an input gear fixed on the at least one rotatable plate, wherein an axial direction of the input gear is a second direction perpendicular to the first direction;

an output gear rotatably connected to the supporting plate, wherein a rotation axis of the output gear extends in the second direction, and the output gear is coaxially connected with the at least one pushing wheel; and a transmission gear set engaging between the input gear and the output gear.

In an exemplary embodiment of the present disclosure, the transmission gear set includes:

a first transmission gear engaging with the input gear;

a second transmission gear engaging with the output gear; and a transmission shaft rotatably connected to the supporting plate in the second direction, wherein one end of the transmission shaft is connected with the first transmission gear, and the other end of the transmission shaft is connected with the second transmission gear.

In an exemplary embodiment of the present disclosure, the input gear is a semicircular gear formed on the rotatable plate.

In an exemplary embodiment of the present disclosure, the supporting plate is provided with a mounting hole and a mounting groove penetrating the supporting plate in a direction perpendicular to the first surface, the at least one pushing wheel is at least partially located in the mounting hole, and the second transmission gear and the output gear are at least partially located in the mounting groove.

In an exemplary embodiment of the present disclosure, the at least one rotatable plate is rotatably connected with the supporting plate through a hinge mechanism, and the hinge mechanism includes:

a fixed portion fixed to the supporting plate;

a rotatable portion fixed to the at least one rotatable plate and distributed along the second direction with the fixed portion and the input gear, wherein a central axis of the rotatable portion and the fixed portion along the second direction and a central axis of the input gear are collinear, and a surface of the rotatable portion close to the fixed portion is provided with an arc-shaped sliding groove;

a hinge pin, wherein one end of the hinge pin penetrates into the fixed portion, and the other end of the hinge pin is slidably fitted in the sliding groove;

wherein when the at least one rotatable plate is rotated between the unfolding position and the folding position, the hinge pin slides along the sliding groove, and when the at least one rotatable plate is in the unfolding position, the hinge pin is located at one end of the sliding groove, and when the at least one rotatable plate is in the folding position, the hinge pin is located at the other end of the sliding groove.

In an exemplary embodiment of the present disclosure, the hinge pin includes a pin body and a pin head located at one end of the pin body, an outer circumference of the pin head protrudes from an outer circumference of the pin body, the pin head is slidably fitted in the sliding groove, and an end of the pin body away from the pin head is located in the fixed portion;

wherein the hinge mechanism further includes:

a second elastic member sleeved on the pin body, wherein one end of the second elastic member rests against the pin head and the other end of the second elastic member rests against the fixed portion, and the second elastic member is in a state of being compressed along an axial direction of the hinge pin.

In an exemplary embodiment of the present disclosure, a surface of the pin head away from the pin body is a spherical surface, and both ends of a bottom surface of the sliding groove have recesses matching a shape of the pin head;

when the at least one rotatable plate is in the unfolding position, the hinge pin is located in one of the recesses of the sliding groove; when the at least one rotatable plate is in the folding position, the hinge pin is located in the other one of the recesses of the sliding groove.

In an exemplary embodiment of the present disclosure, the fixed portion is provided with a blind hole, a step is provided in the blind hole, the hinge pin and the second elastic member both extend into the blind hole, and the second elastic member is clamped between the step and the pin head.

In an exemplary embodiment of the present disclosure, a same one of the at least one rotatable plate is connected to the supporting plate through two hinge mechanisms, and the two hinge mechanisms share a same fixed portion, and limiting portions of the two hinge mechanisms are symmetrically distributed on both sides of the fixed portion.

In an exemplary embodiment of the present disclosure, the at least one rotatable plate is provided with a reinforcing rib connected between the rotatable portions of two hinge mechanisms, and the hinge pin is located on one side of the reinforcing rib.

In an exemplary embodiment of the present disclosure, the at least one pushing wheel is a cam or an eccentric wheel.

In an exemplary embodiment of the present disclosure, the at least rotatable plate includes two rotatable plates, the two rotatable plates are distributed on both sides of the lifting plate along the first direction, and the two rotatable plates are rotatable to each other or away from each other; the at least one pushing wheel includes two pushing wheels, and each of the pushing wheels is connected with a corresponding one of the rotatable plates through a transmission assembly.

In an exemplary embodiment of the present disclosure, the two pushing wheels are distributed along an axial direction of the pushing wheels.

In an exemplary embodiment of the present disclosure, the lifting plate includes a bottom plate and a bulge located on a surface of the bottom plate close to the first surface, and the first elastic member is connected between the bulge and the first surface.

In an exemplary embodiment of the present disclosure, a surface of the lifting plate close to the first surface is provided with a positioning pillar, the first elastic member is a spring, and the first elastic member is sleeved outside the positioning pillar and connected with the positioning pillar.

In an exemplary embodiment of the present disclosure, an edge of the first surface is provided with a supporting arm extending in a direction away from the first surface, and the supporting arm is located on a side of the lifting plate;

when the at least one rotatable plate is in the unfolding position, the supporting arm rests against a surface of the at least one rotatable plate close to the first surface; when the at least one rotatable plate is in the folding position, the at least one rotatable plate is located between the supporting arm and the lifting plate.

According to an aspect of the present disclosure, there is provided a display device, including:

a flexible display panel having a light emitting surface and a rear surface;

the folding device according to any one of claims 1-17, wherein when the at least one rotating plate is in the unfolding position, the rear surface is attached to a surface of the at least one rotatable plate away from the first surface.

It should be understood that the above general description and the following detailed description are only exemplary and explanatory, and should not be considered as constituting any limitations on the present disclosure.

BRIEF DESCRIPTION OF THE DRAWINGS

The drawings, which are incorporated into the specification and constitute a part of the specification, show embodiments in accordance with the disclosure, and are used to explain the principles of the disclosure together with the specification. Understandably, the drawings in the following description are only some embodiments of the present disclosure. For those of ordinary skill in the art, other drawings can be obtained based on these drawings without creative work.

DETAILED DESCRIPTION

Figure 1:
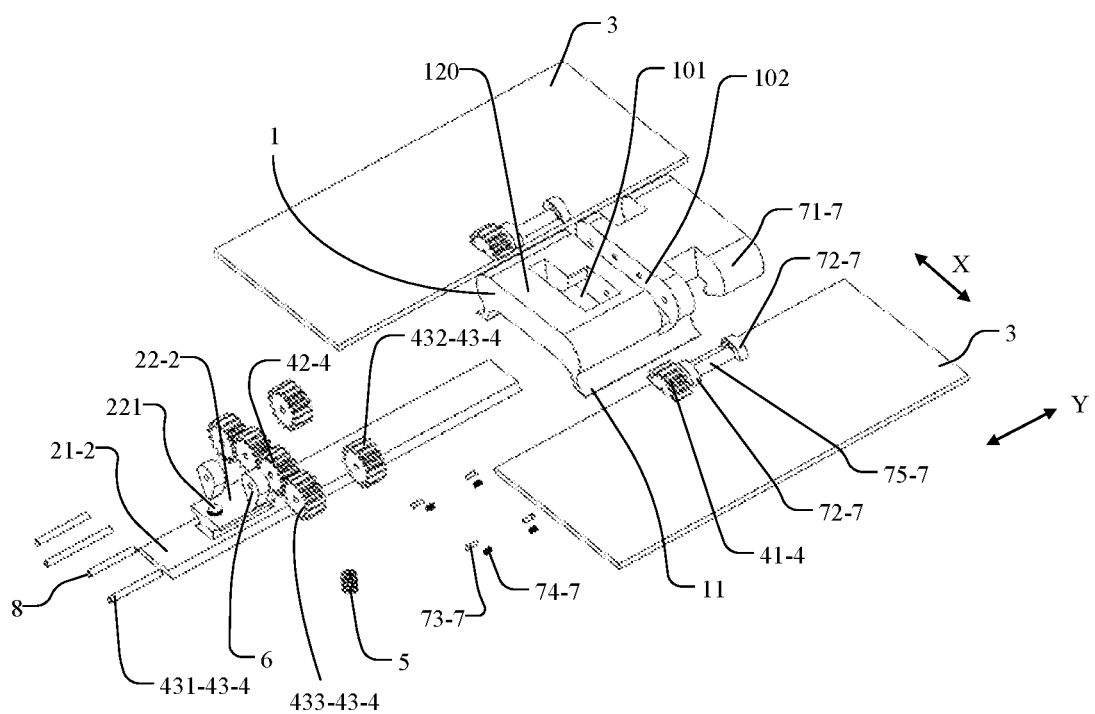
FIG. 1 is an exploded view of a folding device according to an embodiment of the present disclosure.

Example embodiments will now be described more fully with reference to the accompanying drawings. However, the embodiments can be implemented in a variety of forms and should not be construed as being limited to the examples set forth herein; rather, these embodiments are provided so that the present disclosure will be more complete so as to convey the idea of the exemplary embodiments to those skilled in this art. The same reference signs in the drawings indicate the same or similar structures, and thus their repeated descriptions will be omitted. In addition, the drawings are only schematic illustrations of embodiments of the present disclosure, and are not necessarily drawn to scale.

Although relative terms such as "upper" and "lower" are used in this specification to describe relative relationships between one component and another component in a figure, these terms are used only for convenience, for example, these terms are based on the directions shown in the drawings. It can be understood that if a device shown in a figure is turned upside down, a component described as "upper" will become a "lower" component. When a structure is "on" another structure, it may mean that the structure is integrally formed on another structure, or that the structure is "directly" arranged on another structure, or that the structure is "indirectly" arranged on another structure through a further structure.

The terms "a", "an", "the", "said", and "at least one" are used to indicate the presence of one or more elements/components, and so on; the terms "include" and "have" are open terms and means inclusive, and refer to that in addition to the listed elements/components and so on, there may be other elements/components and so on. The terms "first", "second", and so on are only used as marks, and should not be considered as constituting any limitations on the number of objects.

In the related art, a foldable flexible display panel has a light emitting surface and a rear surface. The folding manner in which the foldable flexible display panel folds may include inward folding and outward folding. The outward folding refers to a folding method in which rear surfaces are closed to each other after folding. The inward folding refers to a folding method in which light emitting surfaces are closed to each other. In order to support the flexible display panel during folding, it is usually needed to attach the flexible display panel onto a folding device. The folding device generally includes two flat plates which can relatively rotate, and a connection plate between the two flat plates. The rotation of the two flat plates with respect to the connection plate allows the flexible display panel to fold. For the flexible display panel adopting the inward folding method, during the folding, an area of the flexible display panel corresponding to the connection plate needs to be deformed to form a folding area to ensure smooth folding. However, because the connection plate fixedly supports against the flexible display panel, the folding area cannot be bent and deformed normally, wrinkles may easily occur, and it is easy for the flexible display panel to be damaged.

An embodiment of the present disclosure provides a folding device for a flexible display panel. The flexible display panel may be an Organic Light-Emitting Diode (OLED) display panel, and the flexible display panel has a light emitting surface and a rear surface.

A listing of reference signs used in the figures is as follows: 1: supporting plate; 11: supporting arm; 110: first surface; 120: second surface; 101: mounting hole; 102: mounting groove; 2: lifting plate; 21: bottom plate; 22: bulge; 221: positioning pillar; 3: rotatable plate; 4: transmission assembly; 41: input gear; 42: output gear; 43: transmission gear set; 431: transmission shaft; 432: first transmission gear; 433: second transmission gear; 5: first elastic member; 6: pushing wheel; 7: hinge mechanism; 71: fixed portion; 711: blind hole; 712: step; 72: rotatable portion; 721: sliding groove; 722: recess; 73: hinge pin; 731: pin body; 732: pin head; 74: second elastic member; 75: reinforcing rib; and 8: rotation shaft.

As shown in FIG. 1 to FIG. 6, the folding device according to the embodiment of the present disclosure includes a supporting plate 1, a lifting plate 2, at least one rotatable plate 3, a transmission assembly 4, a first elastic member 5, and at least one pushing wheel 6.

The supporting plate 1 has a first surface 110 and a second surface 120 which are opposite to each other.

The lifting plate 2 is arranged on a side of the first surface 110 away from the second surface 120. There is a gap between the lifting plate 2 and the first surface 110.

The at least one rotatable plate 3 is arranged on the side of the first surface 110 away from the second surface 120 and is distributed on a side of the lifting plate along a first direction. The at least one rotatable plate 3 is rotatably connected to the supporting plate 1 and is rotatable between a folding position and an unfolding position. The at least one rotatable plate 3 and the supporting plate 1 are coplanar in the unfolding position; and the at least one rotatable plate 3 and the supporting plate 1 are located on different planes in the folding position. The at least one rotatable plate 3 is used for attaching the flexible display panel to allow the flexible display panel to fold or unfold.

The transmission assembly 4 is arranged on the supporting plate 1 and is connected with the at least one rotatable plate 3.

The first elastic member 5 is arranged between the lifting plate 2 and the supporting plate 1. The first elastic member is used to apply to the lifting plate 2 a force toward the first surface 110.

The at least one pushing wheel 6 is arranged between the lifting plate 2 and the supporting plate 1, and is connected to the at least one rotatable plate 3 through the transmission assembly 4. The at least one pushing wheel 6 is rotatable under driving of the at least one rotatable plate 3. A contour of the at least one pushing wheel 6 includes at least a distal end point and a proximal end point, and a distance between the distal end point and a rotation axis of the at least one pushing wheel 6 and a distance between the proximal end point and the rotation axis of the at least one pushing wheel 6 are different.

Rotating of the at least one rotatable plate 3 from the folding position to the unfolding position causes the at least one pushing wheel 6 to push the lifting plate 2 to a supporting position in a direction away from the first surface 110, and during rotating of the at least one rotatable plate 3 from the unfolding position to the folding position, the first elastic member enables the lifting plate 2 to move to an avoidance position in a direction close to the first surface 110.

Figure 2:
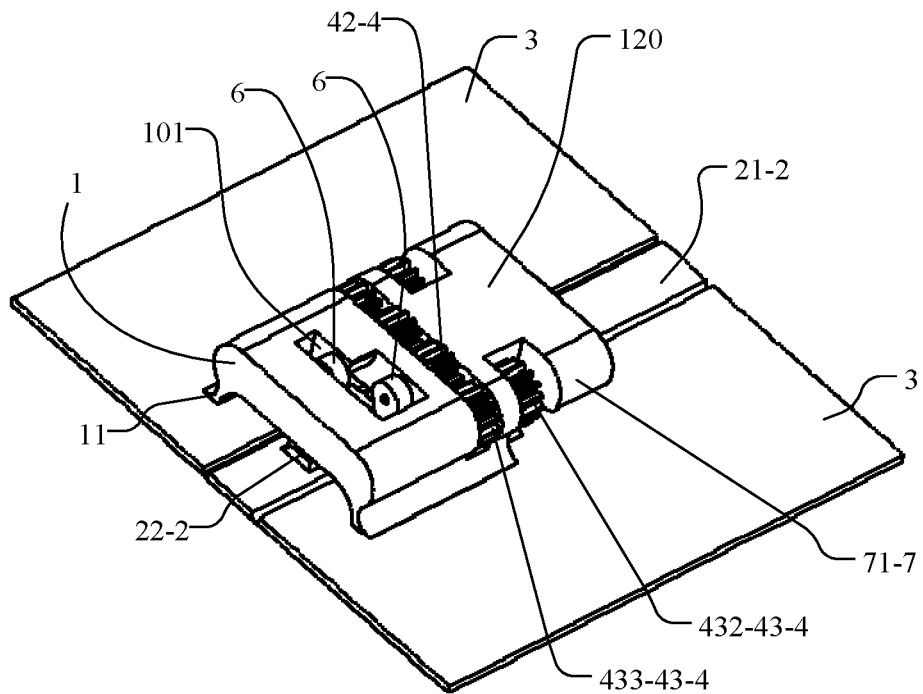
FIG. 2 is an assembly diagram of a folding device after unfolding according to an embodiment of the disclosure.
Figure 3:
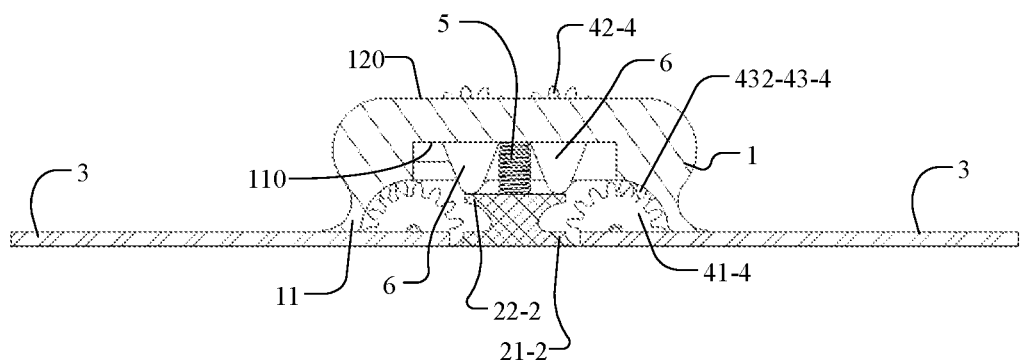
FIG. 3 is a cross-sectional view of a folding device after unfolding according to an embodiment of the present disclosure.

When using the folding device according to the embodiment of the present disclosure, as shown in FIG. 2 and FIG. 3, the rotatable plate 3 can be placed in the unfolding position, that is, a position where the rotatable plate 3 is coplanar with the lifting plate 2. The flexible display panel can be attached to a surface of the rotatable plate 3 away from the first surface 110. In this case, the flexible display panel is in contact with the rotatable plate 3 and the lifting plate 2 at the same time, but no special connection with the lifting plate 2 is required, so as to prevent the normal folding of the flexible display panel from being affected. The pushing wheel 6 supports the lifting plate 2 on a surface of the lifting plate 2 close to the first surface 110, so that the lifting plate 2 is in a supporting position, thereby overcoming the pulling force applied to the lifting plate 2 by the first elastic member 5 toward the first surface 110.

Figure 4:
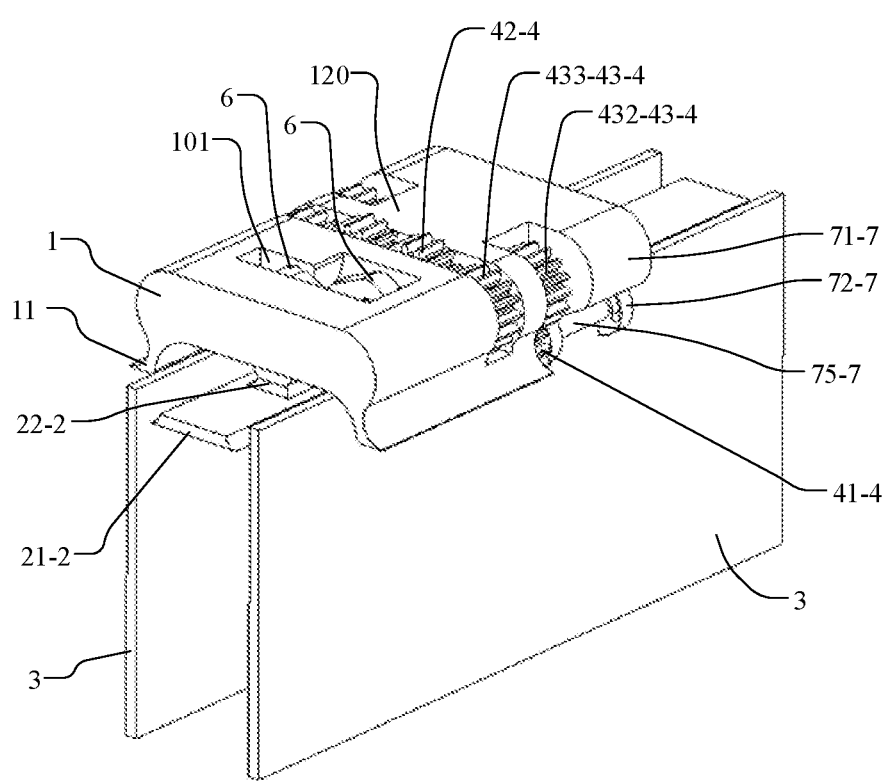
FIG. 4 is an assembly diagram of a folding device after folding according to one embodiment of the disclosure.
Figure 5:
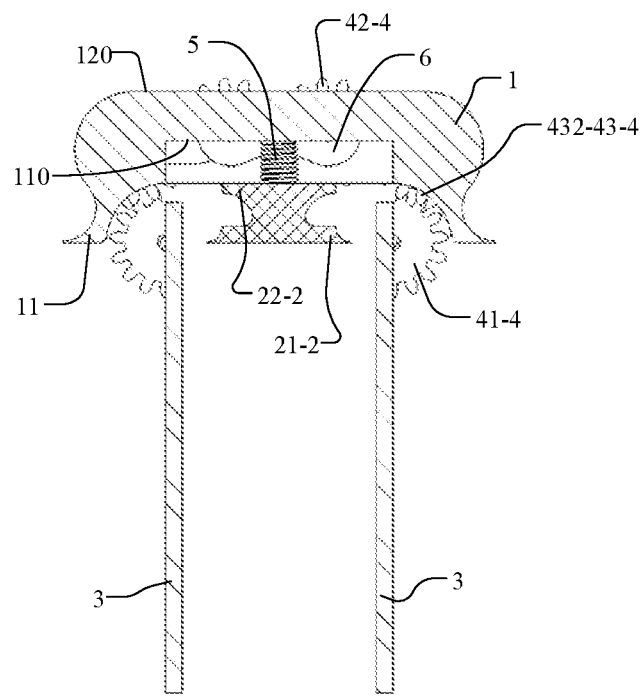
FIG. 5 is a cross-sectional view of a folding device after folding according to an embodiment of the disclosure.
Figure 6:
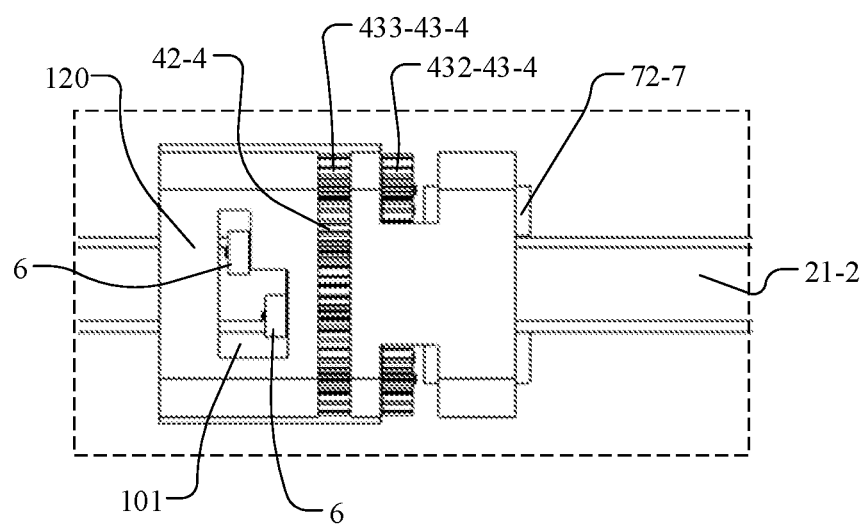
FIG. 6 is a partial top view of a folding device according to an embodiment of the present disclosure.

As shown in FIG. 4 and FIG. 5, if the flexible display panel needs to be bent, the rotatable plate 3 can be rotated manually or with the help of other external forces. The rotation of the rotatable plate 3 brings the flexible display panel to fold. At the same time, the pushing wheel 6 rotates, the lifting plate 2 gradually loses the supporting force from the pushing wheel 6, so that under the action of the first elastic member 5, the lifting plate 2 moves to an avoidance position in the direction close to the first surface 110. As the lifting plate 2 moves toward the first surface 110, an accommodating space for the folding area of the flexible display panel is formed, to ensure that the flexible display panel can be bent smoothly. And, during the moving of the lifting plate 2, the lifting plate 2 can always support the flexible display panel, thereby realizing dynamic support for the folding area.

During the folding and unfolding of the flexible display panel, the lifting plate 2 can support the folding area of the flexible display panel to prevent damage to the folding area.

Hereinafter, parts of the folding device according to embodiments of the present disclosure will be described in detail.

As shown in FIGS. 1 to 5 and 10, the supporting plate 1 is a flat plate structure, and its shape and size are not specifically limited here. The supporting plate 1 has a first surface 110 and a second surface 120 opposite to each other, and the first surface 110 and the second surface 120 may be planes parallel to each other.

As shown in FIGS. 1 to 5 and 11, the lifting plate 2 can be a flat structure, and the rotatable plate 3 can be attached to the flexible display panel so that the rotation of the rotatable plate 3 drives the flexible display panel to unfold or fold. The shape of the lifting plate 2 may be rectangular or other shape. For example, the lifting plate 2 is a rectangular flat plate structure, and its width in the width direction is smaller than the width of the supporting plate 1, and the length of the lifting plate 2 in the length direction is greater than the length of the supporting plate 1.

The lifting plate 2 is arranged on a side of the first surface 110 of the supporting plate 1 away from the second surface 120, and the lifting plate 2 can be arranged parallel to the first surface 110. There is a gap between the lifting plate 2 and the first surface 110. The lifting plate 2 can move backward and forward between the supporting position and the avoidance position in a direction perpendicular to the first surface 110, so that the lifting plate 2 is always parallel to the first surface 110 during the movement of the lifting plate 2. The supporting position is on a side of the avoidance position away from the first surface 110.

As shown in FIGS. 1 to 5 and 12, the first elastic member 5 may be provided between the lifting plate 2 and the supporting plate 1. The first elastic member 5 is used for applying a force toward the first surface 110 to the lifting plate 2 to make the lifting plate 2 have a tendency to move to the avoidance position. The first elastic member 5 may be a spring or a rubber band or other devices that can be elastically deformed to apply the above-mentioned force to the lifting plate 2. There may be one or more first elastic members 5.

In some embodiments of the present disclosure, the first elastic member 5 is a spring. In order to facilitate the installation of the spring, a surface of the lifting plate 2 close to the first surface 110 may be provided with a positioning pillar 221, and the first elastic member 5 may be sleeved on the positioning pillar 221 and connected with the positioning pillar 221. The height of the positioning pillar 221 is smaller than the distance between the lifting plate 2 and the first surface 110 when the lifting plate 2 is in the avoidance position.

In some embodiments of the present disclosure, as shown in FIGS. 1, 3, 5, and 11, the lifting plate 2 may include a bottom plate 21 and a bulge 22.

The bottom plate 21 is a flat structure parallel to the first surface 110.

The bulge 22 is located on a surface of the bottom plate 21 close to the first surface 110, and the shape of the bulge 22 is not specifically limited here. The first elastic element 5 can be connected between the bulge 22 and the first surface 110. For example, the first elastic element 5 is a spring. The positioning pillar 221 described above may be provided on a surface of the bulge 22 away from the bottom plate 21, i.e., a surface of the lifting plate close to the first surface 110. The first elastic member 5 may be sleeved outside the positioning pillar 221 and connected to the positioning pillar 221.

As shown in FIGS. 1 to 5 and FIG. 13, the rotatable plate 3 can be a flat plate structure, and its shape can be rectangular or other shapes. The rotatable plate 3 is arranged on the side of the first surface 110 away from the second surface 120, that is, the rotatable plate 3 and the lifting plate 2 are located on the same side of the supporting plate 1. Also, the rotatable plate 3 can be distributed on a side of the lifting plate 2 along the first direction, and the rotatable plate 3 can be rotatably connected with the supporting plate 1 and can rotate between the folding position and the unfolding position. The first direction is shown as the X direction in FIG. 1.

In some embodiments of the present disclosure, the shape of the rotatable plate 3 and the lifting plate 2 are both rectangular, the length of the two is the same, and the width of the rotatable plate 3 is greater than the width of the lifting plate 2. The long side of the rotatable plate 3 and the long side of the lifting plate 2 are arranged in parallel.

The specific implementation for realizing the rotational connection of the rotatable plate 3 and the supporting plate 1 will be described in detail below.

When the rotatable plate 3 is in the unfolding position, the rotatable plate 3 is coplanar with the supporting plate 1, that is, the surface of the rotatable plate 3 away from the first surface 110 and the surface of the supporting plate 1 away from the first surface 110 are located on the same plane, that is, the angle between the rotatable plate 3 and the supporting plate 1 is 180°. When the rotatable plate 3 is in the folding position, the rotatable plate 3 and the supporting plate 1 are on different planes, that is, there is an angle between the rotatable plate 3 and the supporting plate 1, and the angle is greater than 0° and less than 180°. For example, when the rotatable plate 3 is in the folding position, the angle between the rotatable plate 3 and the supporting plate 1 is 90°. The rotation angle of the rotatable plate 3 in embodiments of the present disclosure is not particularly limited, and can be determined according to the maximum folding amplitude that the flexible display panel can withstand.

In order to limit the position of the rotatable plate 3, after the rotatable plate 3 rotates to the unfolding position, it cannot rotate in a direction close to the supporting plate 1 so as to maintain a coplanar state with the lifting plate 2, and thus to make the unfolded flexible display panel more flat. In some embodiments of the present disclosure, the edge of the first surface 110 of the supporting plate 1 may be provided with a supporting arm 11 extending in a direction away from the first surface 110, and the supporting arm 11 is located on a side of the lifting plate 2. When the rotatable plate 3 is in the unfolding position, the supporting arm 11 rests against the surface of the rotatable plate 3 close to the first surface 110 to support the rotatable plate 3. When the rotatable plate 3 is in the folding position, the rotatable plate 3 is located between the supporting arm 11 and the lifting plate 2 to prevent the rotation of the rotatable plate 3 from being influenced.

As shown in FIGS. 1 to 6, the pushing wheel 6 is provided between the lifting plate 2 and the supporting plate 1, and is connected to the rotatable plate 3 through the transmission assembly 4 provided on the supporting plate 1. The rotation axis of the pushing wheel 6 is parallel to the rotation axis of the rotatable plate 3, and the pushing wheel 6 can rotate under the driving of the rotatable plate 3. The contour of the pushing wheel 6 includes at least a distal end point and a proximal end point. The distance between the distal end point and the rotation axis of the pushing wheel 6 is different from the distance between the proximal end point and the rotation axis of the pushing wheel 6, so that the reciprocation of the lifting plate 2 can be realized in cooperation with the force of the first elastic member 5.

Specifically, as shown in FIGS. 2 and 3, during the rotating of the rotatable plate 3 from the folding position to the unfolding position, the transmission assembly 4 can drive the pushing wheel 6 to rotate until the distal end point rests against the lifting plate 2 (for example, the pushing wheel 6 contacts the surface of the bulge 22 close to the first surface 110), thereby pushing the lifting plate 2 to the supporting position in the direction away from the first surface 110. The supporting position is the farthest position where the pushing wheel 6 pushes the lifting plate 2 to move in a direction away from the first surface 110.

As shown in FIGS. 4 and 5, during the rotating of the rotatable plate 3 from the unfolding position to the bent position, the distal end point no longer contacts the lifting plate 2, and the force of the first elastic member 5 on the lifting plate 2 can make the lifting plate 2 move in a direction close to the first surface 110 until the lifting plate 2 moves to the avoidance position.

In some embodiments of the present disclosure, when the lifting plate 2 is in the avoidance position, the lifting plate 2 can contact the pushing wheel 6. Specifically, under the action of the pulling force of the first elastic member 5, the lifting plate 2 moves from the supporting position to the avoidance position toward the first surface 110. At this time, the proximal end point of the pushing wheel 6 contacts the lifting plate 2 and the first elastic member 5 is still in a stretched state. That is to say, under the action of the pulling force of the first elastic member 5, the lifting plate 2 is always in contact with the pushing wheel 6, but because the pushing wheel 6 has a distal end point and a proximal end point, the lifting plate 2 can move between the supporting position and the avoidance position.

In some other embodiments of the present disclosure, when the lifting plate 2 is in the avoidance position, the lifting plate 2 can be separated from the pushing wheel 6. Specifically, when the lifting plate 2 moves from the supporting position to the avoidance position toward the first surface 110, the force applied by the first elastic member 5 to the lifting plate 2 can make the lifting plate 2 move toward the first surface 110 for a certain distance, but it is not enough to make the lifting plate 2 contact the proximal end point of the pushing wheel 6; or, before the lifting plate 2 contacts the proximal end point of the pushing wheel 6, the first elastic member 5 has returned to a free state (neither stretched nor compressed), and the lifting plate 2 stops moving. At this time, the position of the lifting plate 2 is the avoidance position.

As shown in FIGS. 1 to 5, in some embodiments of the present disclosure, the pushing wheel 6 may be a cam, and a point in its contour that is farthest from the rotation axis is the distal end point, and a point closest to the rotation axis is the proximal end point. The contour of the cam can be involute or other shapes, and its shape is not specifically limited here.

In some other embodiments of the present disclosure, the pushing wheel 6 can be an eccentric wheel, the outline of which can be circular, but the center of the circle is outside the rotation axis. A point farthest from the rotation axis is the distal end point, and a point closest to the rotation axis is the proximal end point.

The following is an exemplary description of the transmission assembly 4.

As shown in FIGS. 1 to 7, in some embodiments of the present disclosure, the transmission assembly 4 may include multiple gears. The successive transmission using the multiple gears drives the pushing wheel 6 to rotate. Specifically, the transmission assembly 4 may include an input gear 41, an output gear 42, and a transmission gear set 43.

The input gear 41 is fixed on the rotatable plate 3 and can rotate synchronously with the rotatable plate 3. Further, the axial direction of the input gear 41 is a second direction perpendicular to the first direction. The second direction is shown in the Y direction in FIG. 1. Further, the input gear 41 can be a semicircular gear fixed on a surface of the rotatable plate 3 close to the first surface 110 (when the rotatable plate 3 is in the unfolding position), and the semicircular gear can be integrally formed with the rotatable plate 3. Of course, the input gear 41 can be an independent structure fixed on the rotatable plate 3 by means of snapping or the like.

The output gear 42 is rotatably connected to the supporting plate 1, its rotation axis is collinear with the rotation axis of the cam in the second direction, and the output gear 42 is coaxially connected with the pushing wheel 6. For example, the output gear 42 and the pushing wheel 6 are connected through a rotation shaft 8 extending in the second direction. Therefore, the output gear 42 can drive the pushing wheel 6 to rotate synchronously.

The transmission gear set 43 can engage between the input gear 41 and the output gear 42. When the input gear 41 rotates, the output gear 42 can be driven to rotate. For example, the transmission gear set 43 may include a first transmission gear 432, a second transmission gear 433 and a transmission shaft 431.

The transmission shaft 431 is rotatably connected to the supporting plate 1.

The first transmission gear 432 is connected to one end of the transmission shaft 431 and meshes with the input gear 41.

The second transmission gear 433 is connected to the other end of the transmission shaft 431 and meshes with the output gear 42.

When the rotatable plate 3 drives the input gear 41 to rotate, the first transmission gear 432 can be driven to rotate, the first transmission gear 432 can drive the second transmission gear 433 to rotate synchronously through the transmission shaft 431, and the second transmission gear 433 can drive the output gear 42 to rotate, thereby enabling the pushing wheel 6 to rotate.

Of course, the structure of the transmission assembly 4 is not limited to the above-mentioned structure. In other embodiments of the present disclosure, the transmission assembly 4 may adopt other structures, as long as the rotatable plate 3 can drive the pushing wheel 6 to rotate.

As shown in FIGS. 1 to 7 and 10, in order to facilitate the installation of the transmission assembly 4 and the pushing wheel 6, in some embodiments of the present disclosure, a mounting hole 101 and a mounting groove 102 may be provided on the supporting plate 1. Both the mounting groove 101 and the mounting groove 102 penetrate the supporting plate 1 in a direction perpendicular to the first surface 110, and the mounting groove 102 can also penetrate the supporting plate 1 in the first direction. The pushing wheel 6 is at least partially located in the mounting hole 101, and the lifting plate 2 is directly opposite to the mounting hole 101, so that the pushing wheel 6 can be in contact with the lifting plate 2. The second transmission gear 433 and the output gear 42 are at least partially located in the mounting groove 102. The rotation shaft 8 connecting the output gear 42 and the pushing wheel 6 can extend into the mounting hole 101 through the mounting groove 102 and rotatably cooperate with the supporting plate 1. The first transmission gear 432 and the input gear 41 may be located outside the supporting plate 1.

The following is an exemplary description of the manner in which the rotatable plate 3 and the supporting plate 1 are rotatably connected.

As shown in FIGS. 1, 7 to 9 and 13 to 15, in some embodiments of the present disclosure, the rotatable plate 3 can be rotatably connected to the supporting plate 1 through a hinge mechanism 7. The hinge mechanism 7 may include a fixed portion 71, a rotatable portion 72 and a hinge pin 73.

The fixed portion 71 can be fixed to the supporting plate 1. For example, the supporting plate 1 has two sides away from each other in the first direction, and the fixed portion 71 can be fixed to the side of the supporting plate 1 close to the rotatable plate 3. The fixed portion 71 may be an independent member fixed to the supporting plate 1 by a snap connection or other connection methods, or may be a protrusion structure integrally formed on the supporting plate 1.

The rotatable portion 72 is fixed on a surface of the rotatable plate 3 close to the first surface 110 (when the rotatable plate 3 is in the unfolding position), and is distributed along the second direction with the fixed portion 71 and the input gear 41. The central axis of the rotatable portion 72 and the fixed portion 71 in the second direction is collinear with the central axis of the input gear 41. A surface of the rotatable portion 72 close to the fixed portion 71 is provided with an arc-shaped sliding groove 721, the center of curvature of the sliding groove 721 is located on the central axis of the rotatable portion 72 in the second direction, and the curvature of the sliding groove 721 is the same as the curvature of the input gear 41. The rotatable portion 72 can be integrally formed arc shape, of course, or it can be of other shapes.

Figure 7:
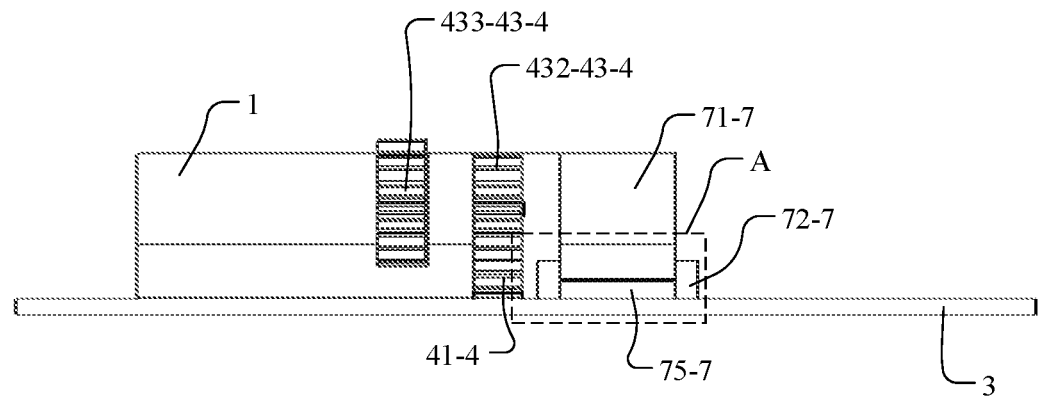
FIG. 7 is a side view of a folding device according to an embodiment of the present disclosure.
Figure 8:
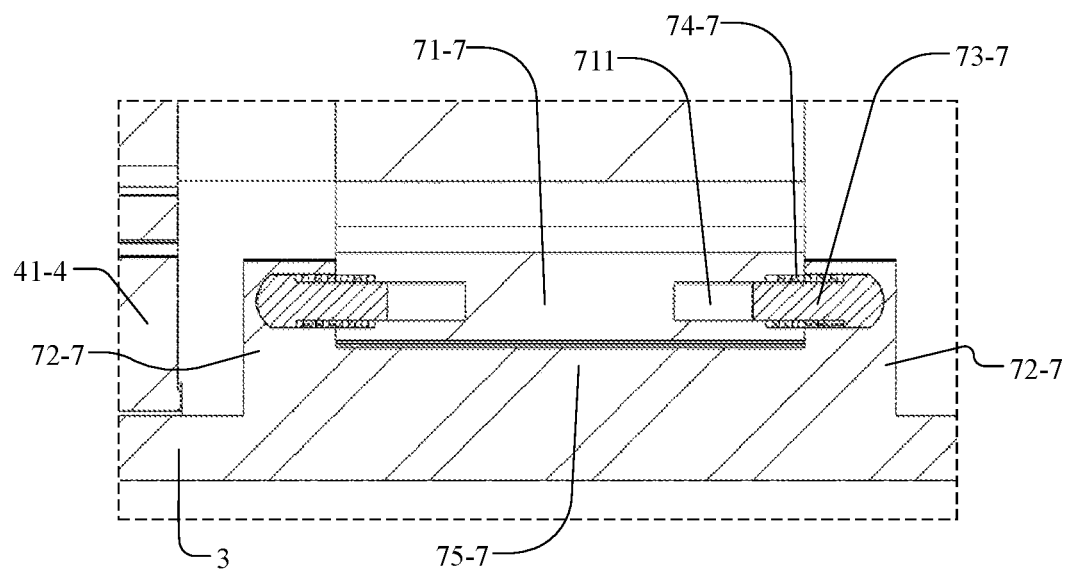
FIG. 8 is a partial cross-sectional view of part A in FIG. 7.
Figure 9:
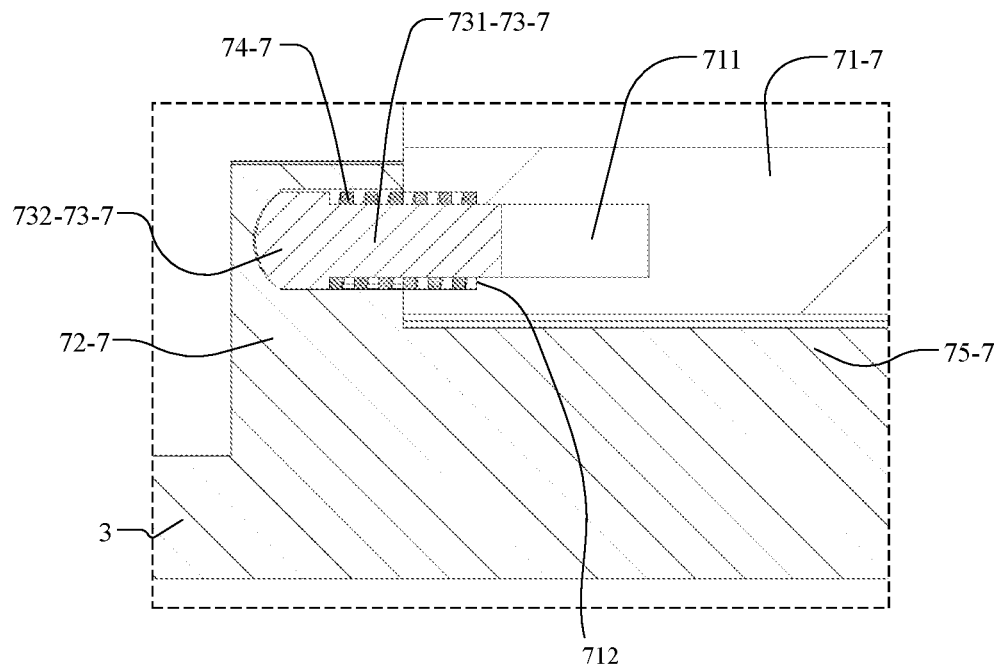
FIG. 9 is a partial enlarged view of FIG. 8.
Figure 10:
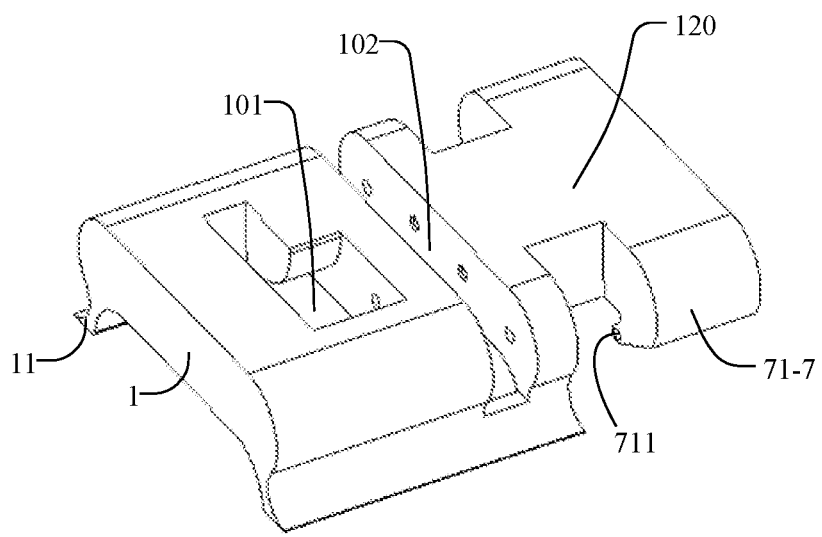
FIG. 10 is a schematic diagram of a supporting plate of a folding device according to an embodiment of the present disclosure.
Figure 11:
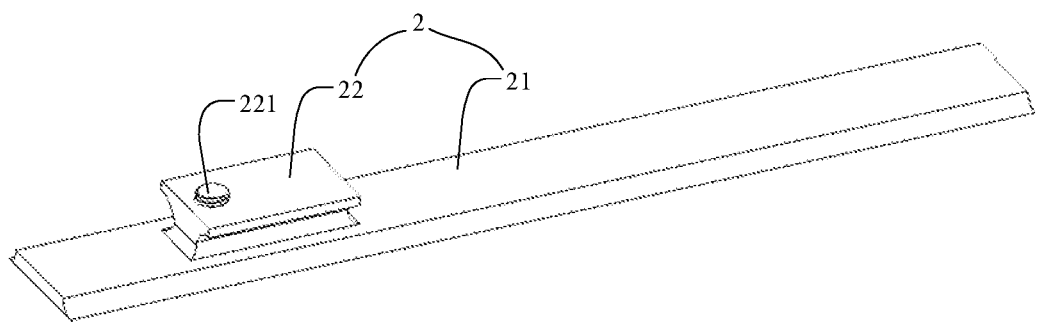
FIG. 11 is a schematic diagram of a lifting plate of a folding device according to an embodiment of the present disclosure.
Figure 12:
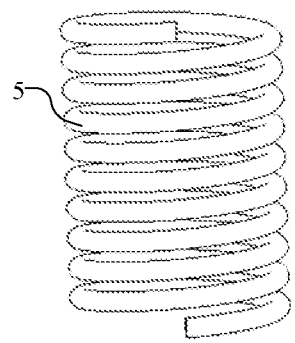
FIG. 12 is a schematic diagram of a first elastic member of a folding device according to an embodiment of the disclosure.
Figure 13:
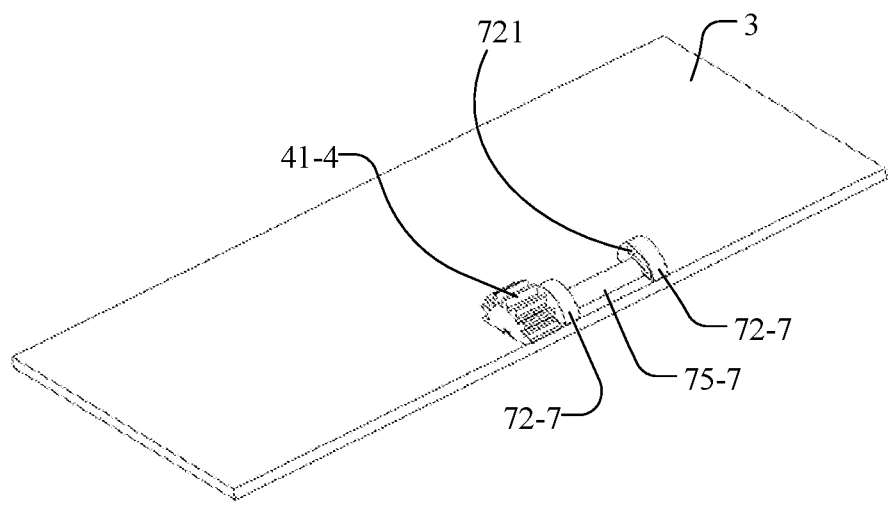
FIG. 13 is a schematic diagram of a rotatable plate of a folding device according to an embodiment of the present disclosure.

As shown in FIGS. 7 to 9, one end of the hinge pin 73 penetrates into the fixed portion 71, and the other end is slidably fitted in the sliding groove 721.

When the rotatable plate 3 is rotated between the unfolding position and the folding position, the hinge pin 73 slides along the sliding groove 721. When the rotatable plate 3 is in the unfolding position, the hinge pin 73 is located at one end of the sliding groove 721. When the rotatable plate 3 is in the folding position, the hinge pin 73 is located at the other end of the sliding groove 721. Thus, the sliding groove 721 can limit the rotation range of the rotatable plate 3. Also, the hinge pin 73 can contact the inner wall of the sliding groove 721, and the frictional force between the hinge pin 73 and the inner wall of the sliding groove 721 can prevent the rotatable plate 3 from rotating freely. After the external force that causes the rotatable plate 3 to rotate disappears, the rotatable plate 3 does not move freely, and accordingly the stop-at-any-position function can be realized.

Figure 15:
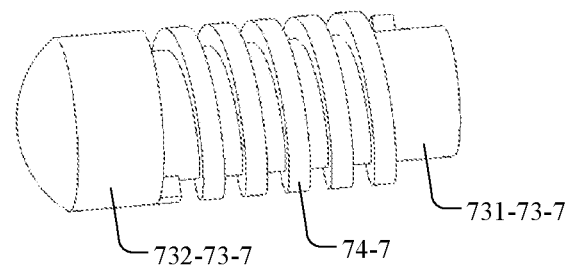
FIG. 15 is a schematic diagram showing a hinge pin and a second elastic member of a folding device according to an embodiment of the disclosure.

Further, as shown in FIGS. 9 and 15, in order to increase the friction between the sliding groove 721 and the hinge pin 73, in some embodiments of the present disclosure, the hinge pin 73 includes a pin body 731 and a pin located at one end of the pin body 731. The outer circumference of the pin head 732 protrudes from the outer circumference of the pin body 731. For example, the pin head 732 has a spherical cap structure, the pin body 731 has a cylindrical structure, and the diameter of the pin body 731 is smaller than the diameter of the pin head 732.

The pin head 732 is slidably fitted in the sliding groove 721 and is in contact with the bottom surface and the side wall of the sliding groove 721. The end of the pin body 731 away from the pin head 732 is located in the fixed portion 71.

The hinge mechanism 7 further includes a second elastic member 74, which can be sleeved outside the pin body 731. One end of the second elastic member 74 rests against the surface of the pin head 732 close to the pin body 731, and the other end rests against the fixed portion 71. Specifically, a position in the fixed portion 71 corresponding to the pin body 731 can be provided with a blind hole 711, and a step 712 is provided in the blind hole 711. The hinge pin 73 and the second elastic member 74 both extend into the blind hole 711, and the second elastic member 74 is clamped between the step 712 and the pin head 732.

The second elastic member 74 is always in a state of being compressed along the axial direction of the hinge pin 73, thereby increasing the pressure of the pin head 732 on the bottom surface of the sliding groove 721, increasing the friction force, and further improving the stop-at-any-position effect.

Figure 14:
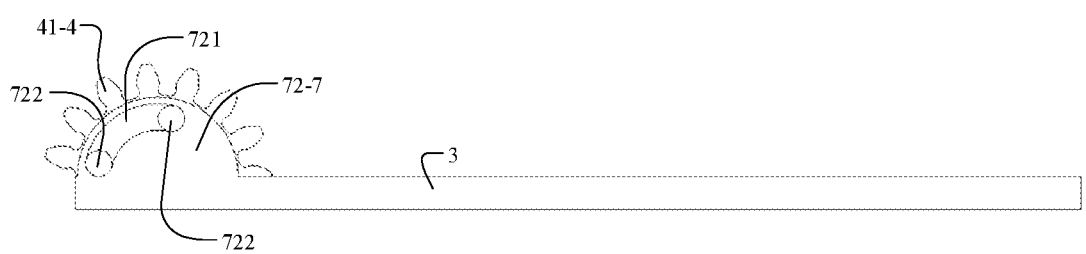
FIG. 14 is a schematic diagram showing a rotatable plate and a rotatable portion of a folding device according to an embodiment of the disclosure.

As shown in FIGS. 9 and 14, in order to limit the rotatable plate 3 to the folding position and the unfolding position, in some embodiments of the present disclosure, the surface of the pin head 732 away from the pin body 731 is a spherical surface, that is, the pin head 732 can be a spherical cap structure. Also, the two ends of the bottom surface of the sliding groove 721 are provided with recesses 722 matching the shape of the pin head 732, that is, the inner surface of each of the recesses 722 is a spherical surface.

When the rotatable plate 3 is in the unfolding position, the pin head 732 is located in one of the recesses 722 of the sliding groove 721; when the rotatable plate 3 is in the folding position, the pin head 732 is located in another one of the recesses 722 of the sliding groove 721. If it is desired to make the pin head 732 slide out of each recess 722, a relatively large external force needs to be applied to the rotatable plate 3, so that the rotatable plate 3 can be positioned in the unfolding position and the bent position.

As shown in FIGS. 1 to 5, in some embodiments of the present disclosure, the same rotatable plate 3 can be connected to the supporting plate 1 through two hinge mechanisms 7 as described above, and the two hinge mechanisms 7 can be distributed along the second direction. Further, the two hinge mechanisms 7 can share the same fixed portion 71, and the limiting portions of the two hinge mechanisms 7 can be symmetrically distributed on both sides of the fixed portion 71, and the central axes of the hinge pins 73 of the two hinge mechanisms 7 are collinear. The detailed structure of the hinge mechanism 7 can be found in the description regarding the above embodiments, which will not be repeated here.

Further, a reinforcing rib 75 connected between the rotatable portions 72 of the two hinge mechanisms 7 can be provided on the rotatable plate 3 to support the two rotatable portions 72, so as to improve the strength of the two and make them difficult to deform. The hinge pin 73 is located on a side of the reinforcing rib 75 to avoid interference with the reinforcing rib 75.

As shown in FIGS. 1 to 5, in some embodiments of the present disclosure, the number of the at least one rotatable plate 3 may be two, and the two rotatable plates 3 are symmetrically distributed on both sides of the lifting plate 2 along the first direction, and both are rotatably connected with the supporting plate 1, so that the two rotatable plates 3 can rotate toward or away from each other, but the two rotatable plates are always located on the side of the first surface 110 of the supporting plate 1 away from the second surface 120. Both rotatable plates 3 can be rotatably connected with the supporting plate 1 through the above-mentioned hinge mechanisms 7. The hinge mechanisms 7 of the two rotatable plates 3 are symmetrically arranged with respect to the lifting plate 2, and the specific structure thereof is not described in detail here.

Correspondingly, as shown in FIGS. 1 to 5, in some embodiments of the present disclosure, the number of the at least one pushing wheel 6 is also two, and the two pushing wheels are respectively connected to the two rotatable plates 3 through the transmission assembly 4 in a one-to-one correspondence, that is, each pushing wheel 6 is connected to a corresponding rotatable plate 3 through a transmission assembly 4. The two transmission assemblies 4 are symmetrically distributed with respect to the central axis of the lifting plate 2 in the second direction, and the two pushing wheels 6 can cooperate with the first elastic member 5 at the same time or independently to realize the movement of the lifting plate 2. In addition, in order to prevent the two pushing wheels 6 from interfering with each other during rotation, the two pushing wheels 6 can be distributed along the second direction perpendicular to the first direction, that is, along the axial direction of the pushing wheels 6, that is, distributed along the second direction, so as to avoid collision.

When the two rotatable plates 3 are both in the unfolding position, the lifting plate 2 is in the supporting position, and the rotatable plate 3 is coplanar with the lifting plate 2 to support the flexible display panel. When the two rotatable plates 3 are in the folding position, the lifting plate 2 is in the avoidance position, there is an angle between the rotatable plates 3 and the lifting plate 2, so that the flexible display panel is bent, and the folding area contacts the lifting plate 2.

An embodiment of the present disclosure further provides a display device, which may include the flexible display panel and the folding device.

The flexible display panel has a light emitting surface and a rear surface opposite to each other. The flexible display panel can be bent under the action of an external force.

The folding device is the folding device as described in any of the above embodiments, and its structure and working principle will not be repeated here. When the at least one rotatable plate 3 is in the unfolding position, the rear surface is attached to a surface of the rotatable plate 3 away from the first surface 110.

For the beneficial effects of the display device according to embodiments of the present disclosure, the beneficial effects of the above folding device can be referred to, and repeated descriptions will be omitted here. The display device may be an electronic device with an image display function, such as a mobile phone, a tablet computer, or a television.

Those skilled in the art will easily think of other embodiments of the present disclosure after considering the specification and practicing the invention disclosed herein. The present disclosure is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and embodiments are exemplary, and the scope and spirit of the present disclosure are defined by the appended claims.

What is claimed is:

1. A folding device for a flexible display panel, the folding device comprising:
   a supporting plate having a first surface and a second surface which are opposite to each other;
   a lifting plate arranged on a side of the first surface away from the second surface, wherein there is a gap between the lifting plate and the first surface;
   at least one rotatable plate arranged on the side of the first surface away from the second surface and distributed on a side of the lifting plate along a first direction, wherein:
      the at least one rotatable plate is rotatably connected to the supporting plate and is rotatable between a folding position and a unfolding position;
      the at least one rotatable plate and the lifting plate are coplanar in the unfolding position;
      the at least one rotatable plate and the lifting plate are located on different planes in the folding position; and
      the at least one rotatable plate is used for attaching the flexible display panel to allow the flexible display panel to fold or unfold;
   a transmission assembly arranged on the supporting plate and connected with the at least one rotatable plate;
   a first elastic member arranged between the lifting plate and the supporting plate, wherein the first elastic member is used to apply to the lifting plate a force toward the first surface; and
   at least one pushing wheel arranged between the lifting plate and the supporting plate, and connected to the at least one rotatable plate through the transmission assembly, wherein the at least one pushing wheel is rotatable under driving of the at least one rotatable plate, a contour of the at least one pushing wheel comprises at least a distal end point and a proximal end point, and a distance between the distal end point and a rotation axis of the at least one pushing wheel and a distance between the proximal end point and the rotation axis of the at least one pushing wheel are different;
   wherein rotating of the at least one rotatable plate from the folding position to the unfolding position causes the at least one pushing wheel to push the lifting plate to a supporting position in a direction away from the first surface, and during rotating of the at least one rotatable plate from the unfolding position to the folding position, the first elastic member enables the lifting plate to move to an avoidance position in a direction close to the first surface.

2. The folding device according to claim 1, wherein the transmission assembly comprises:
an input gear fixed on the at least one rotatable plate, wherein an axial direction of the input gear is a second direction perpendicular to the first direction;
an output gear rotatably connected to the supporting plate, wherein a rotation axis of the output gear extends in the second direction, and the output gear is coaxially connected with the at least one pushing wheel; and
a transmission gear set engaging between the input gear and the output gear.

3. The folding device according to claim 2, wherein the transmission gear set comprises:
a first transmission gear engaging with the input gear;
a second transmission gear engaging with the output gear; and
a transmission shaft rotatably connected to the supporting plate in the second direction, wherein one end of the transmission shaft is connected with the first transmission gear, and the other end of the transmission shaft is connected with the second transmission gear.

4. The folding device according to claim 2, wherein the input gear is a semicircular gear formed on the rotatable plate.

5. The folding device according to claim 3, wherein the supporting plate is provided with a mounting hole and a mounting groove penetrating the supporting plate in a direction perpendicular to the first surface, the at least one pushing wheel is at least partially located in the mounting hole, and the second transmission gear and the output gear are at least partially located in the mounting groove.

6. The folding device according to claim 2, wherein the at least one rotatable plate is rotatably connected with the supporting plate through a hinge mechanism, and the hinge mechanism comprises:
a fixed portion fixed to the supporting plate;
a rotatable portion fixed to the at least one rotatable plate and distributed along the second direction with the fixed portion and the input gear, wherein a central axis of the rotatable portion and the fixed portion along the second direction and a central axis of the input gear are collinear, and a surface of the rotatable portion close to the fixed portion is provided with an arc-shaped sliding groove; and
a hinge pin, wherein one end of the hinge pin penetrates into the fixed portion, and the other end of the hinge pin is slidably fitted in the sliding groove;
wherein when the at least one rotatable plate is rotated between the unfolding position and the folding position, the hinge pin slides along the sliding groove, and when the at least one rotatable plate is in the unfolding position, the hinge pin is located at one end of the sliding groove, and when the at least one rotatable plate is in the folding position, the hinge pin is located at the other end of the sliding groove.

7. The folding device according to claim 6, wherein the hinge pin comprises a pin body and a pin head located at one end of the pin body, an outer circumference of the pin head protrudes from an outer circumference of the pin body, the pin head is slidably fitted in the sliding groove, and an end of the pin body away from the pin head is located in the fixed portion;
wherein the hinge mechanism further comprises: a second elastic member sleeved on the pin body, wherein one end of the second elastic member rests against the pin head and the other end of the second elastic member rests against the fixed portion, and the second elastic member is in a state of being compressed along an axial direction of the hinge pin.

8. The folding device according to claim 7, wherein:
a surface of the pin head away from the pin body is a spherical surface, and both ends of a bottom surface of the sliding groove have recesses matching a shape of the pin head; and
when the at least one rotatable plate is in the unfolding position, the hinge pin is located in one of the recesses of the sliding groove; when the at least one rotatable plate is in the folding position, the hinge pin is located in the other one of the recesses of the sliding groove.

9. The folding device according to claim 7, wherein the fixed portion is provided with a blind hole, a step is provided in the blind hole, the hinge pin and the second elastic member both extend into the blind hole, and the second elastic member is clamped between the step and the pin head.

10. The folding device according to claim 6, wherein a same one of the at least one rotatable plate is connected to the supporting plate through two hinge mechanisms, and the two hinge mechanisms share a same fixed portion, and limiting portions of the two hinge mechanisms are symmetrically distributed on both sides of the fixed portion.

11. The folding device according to claim 10, wherein the at least one rotatable plate is provided with a reinforcing rib connected between the rotatable portions of two hinge mechanisms, and the hinge pin is located on one side of the reinforcing rib.

12. The folding device according to claim 1, wherein the at least one pushing wheel is a cam or an eccentric wheel.

13. The folding device according to claim 1, wherein:
the at least rotatable plate comprises two rotatable plates, the two rotatable plates are distributed on both sides of the lifting plate along the first direction, and the two rotatable plates are rotatable to each other or away from each other; and
the at least one pushing wheel comprises two pushing wheels, and each of the pushing wheels is connected with a corresponding one of the rotatable plates through a transmission assembly.

14. The folding device according to claim 13, wherein the two pushing wheels are distributed along an axial direction of the pushing wheels.

15. The folding device according to claim 1, wherein the lifting plate comprises a bottom plate and a bulge located on a surface of the bottom plate close to the first surface, and the first elastic member is connected between the bulge and the first surface.

16. The folding device according to claim 1, wherein a surface of the lifting plate close to the first surface is provided with a positioning pillar, the first elastic member is a spring, and the first elastic member is sleeved outside the positioning pillar and connected with the positioning pillar.

17. The folding device according to claim 1, wherein:
an edge of the first surface is provided with a supporting arm extending in a direction away from the first surface, and the supporting arm is located on a side of the lifting plate; and when the at least one rotatable plate is in the unfolding position, the supporting arm rests against a surface of the at least one rotatable plate close to the first surface; when the at least one rotatable plate is in the folding position, the at least one rotatable plate is located between the supporting arm and the lifting plate.

18. A display device, comprising:
a flexible display panel having a light emitting surface and a rear surface; and
a folding device, wherein the folding device comprises:
   a supporting plate having a first surface and a second surface which are opposite to each other;
   a lifting plate arranged on a side of the first surface away from the second surface, wherein there is a gap between the lifting plate and the first surface;
   at least one rotatable plate arranged on the side of the first surface away from the second surface and distributed on a side of the lifting plate along a first direction, wherein:
      the at least one rotatable plate is rotatably connected to the supporting plate and is rotatable between a folding position and a unfolding position;
      the at least one rotatable plate and the lifting plate are coplanar in the unfolding position;
      the at least one rotatable plate and the lifting plate are located on different planes in the folding position; and
      the at least one rotatable plate is used for attaching the flexible display panel to allow the flexible display panel to fold or unfold;
   a transmission assembly arranged on the supporting plate and connected with the at least one rotatable plate;
   a first elastic member arranged between the lifting plate and the supporting plate, wherein the first elastic member is used to apply to the lifting plate a force toward the first surface; and
   at least one pushing wheel arranged between the lifting plate and the supporting plate, and connected to the at least one rotatable plate through the transmission assembly, wherein the at least one pushing wheel is rotatable under driving of the at least one rotatable plate, a contour of the at least one pushing wheel comprises at least a distal end point and a proximal end point, and a distance between the distal end point and a rotation axis of the at least one pushing wheel and a distance between the proximal end point and the rotation axis of the at least one pushing wheel are different;
   wherein rotating of the at least one rotatable plate from the folding position to the unfolding position causes the at least one pushing wheel to push the lifting plate to a supporting position in a direction away from the first surface, and during rotating of the at least one rotatable plate from the unfolding position to the folding position, the first elastic member enables the lifting plate to move to an avoidance position in a direction close to the first surface; and
   wherein when the at least one rotating plate is in the unfolding position, the rear surface is attached to a surface of the at least one rotatable plate away from the first surface.

19. The display device according to claim 18, wherein the transmission assembly comprises:
an input gear fixed on the at least one rotatable plate, wherein an axial direction of the input gear is a second direction perpendicular to the first direction;
an output gear rotatably connected to the supporting plate, wherein a rotation axis of the output gear extends in the second direction, and the output gear is coaxially connected with the at least one pushing wheel; and
a transmission gear set engaging between the input gear and the output gear.

20. The display device according to claim 19, wherein the transmission gear set comprises:
a first transmission gear engaging with the input gear;
a second transmission gear engaging with the output gear; and
a transmission shaft rotatably connected to the supporting plate in the second direction, wherein one end of the transmission shaft is connected with the first transmission gear, and the other end of the transmission shaft is connected with the second transmission gear.

* * * * *